(12) United States Patent
Zhang et al.

(10) Patent No.: US 10,510,958 B2
(45) Date of Patent: Dec. 17, 2019

(54) MASK FRAME, MASK AND METHOD FOR MANUFACTURING THE SAME

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Jian Zhang, Beijing (CN); Chun Chieh Huang, Beijing (CN); Fuqiang Tang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/574,455
(22) PCT Filed: Mar. 27, 2017
(86) PCT No.: PCT/CN2017/078269
§ 371 (c)(1),
(2) Date: Nov. 15, 2017
(87) PCT Pub. No.: WO2017/202130
PCT Pub. Date: Nov. 30, 2017

(65) Prior Publication Data
US 2018/0248120 A1  Aug. 30, 2018

(30) Foreign Application Priority Data
May 27, 2016  (CN) .......................... 2016 1 0366372

(51) Int. Cl.
*H01L 51/00* (2006.01)
*C23C 14/04* (2006.01)
(Continued)

(52) U.S. Cl.
CPC .......... *H01L 51/0011* (2013.01); *C23C 14/04* (2013.01); *C23C 14/042* (2013.01);
(Continued)

(58) Field of Classification Search
CPC ....... C23C 14/04; C23C 14/042; C23C 16/04; C23C 16/042
See application file for complete search history.

(56) References Cited

U.S. PATENT DOCUMENTS

2003/0221614 A1* 12/2003 Kang ................... C23C 14/042
                                                      118/504

FOREIGN PATENT DOCUMENTS

| CN | 1603951 A | 4/2005 |
|---|---|---|
| CN | 102691031 A | 9/2012 |

(Continued)

OTHER PUBLICATIONS

Machine translation of KR20070109613A provided by Espacenet.*
(Continued)

*Primary Examiner* — Dah-Wei D. Yuan
*Assistant Examiner* — Stephen A Kitt
(74) *Attorney, Agent, or Firm* — Kinney & Lange, P.A.

(57) ABSTRACT

A mask frame, a mask body, a mask and a method for manufacturing the same are provided in the embodiments of the disclosure. The mask frame includes a loop shaped frame body comprising an outer boundary and an inner boundary, the inner boundary defining a space for receiving a mask body. The mask frame also includes a forced side and a non-forced side, the forced side being subjected to a pulling force of the mask body, the non-forced side being free from the force of the mask body. A width between the outer boundary of the forced side of the mask frame and the inner boundary corresponding to the outer boundary decreases gradually in a direction from a middle position on the forced side toward the non-forced side.

13 Claims, 6 Drawing Sheets

(51) Int. Cl.
  *C23C 16/04* (2006.01)
  *C23C 14/24* (2006.01)
  *H01L 51/56* (2006.01)

(52) U.S. Cl.
  CPC .............. *C23C 14/24* (2013.01); *C23C 16/04* (2013.01); *C23C 16/042* (2013.01); *H01L 51/001* (2013.01); *H01L 51/56* (2013.01)

(56) References Cited

FOREIGN PATENT DOCUMENTS

| CN | 106048520 | A | | 10/2016 |
| KR | 20070109613 | A | * | 11/2007 |
| TW | I297508 | B | | 6/2008 |
| TW | 201044108 | A | | 12/2010 |

OTHER PUBLICATIONS

English Translation of International Search Report & Written Opinion, for PCT Patent Application No. PCT/CN2017/078269, dated Jul. 4, 2017.

First Chinese Office Action, for Chinese Patent Application No. 201610366372.5, dated May 11, 2017, 7 pages.

International Search Report & Written Opinion, for PCT Patent Application No. PCT/CN2017/078269, dated Jul. 4, 2017, 8 pages.

\* cited by examiner

MASK FRAME, MASK AND METHOD FOR MANUFACTURING THE SAME

CROSS-REFERENCE TO RELATED APPLICATION

This disclosure claims the benefit of Chinese Patent Application 201610366372.5 filed on May 27, 2016 in the State Intellectual Property Office of China, the whole disclosure of which is incorporated herein by reference.

Technical Field

The present disclosure relates to a field of the display technology, especially to a mask frame, mask and a method for manufacturing the same, the mask frame and mask being used for manufacturing a display panel.

Description of the Related Art

During production of display panels, especially AMOLED display panels, it is necessary to use a mask. A conventional metal mask frame used for AMOLED, is a regular rectangle hollowed in center. The metal mask frame tends to deform unstably. When all the mask strips are stretched and welded onto the frame, the frame will shrink inwardly, resulting in a deformation, thereby driving the mask body welded onto the frame to causing a pixel position accuracy (PPA) shift thereof.

SUMMARY

The embodiments of the present disclosure provide a mask frame, a mask body, a mask and a method for manufacturing the same, which are used at least for reinforcing stability of the mask frame.

The embodiments of the present disclosure provide a mask frame, comprising: a loop shaped frame body comprising an outer boundary and an inner boundary, the inner boundary defining a space for receiving a mask body; and the mask frame comprising a forced side and a non-forced side, the forced side being subjected to a pulling force of the mask body, the non-forced side being free from the force of the mask body; wherein a width between the outer boundary of the forced side of the mask frame and the inner boundary corresponding to the outer boundary decreases gradually in a direction from a middle position on the forced side toward the non-forced side.

In an exemplary embodiment, in the mask frame provided by the embodiments of the present disclosure, the inner boundary of the mask frame forms a rectangular shape.

In an exemplary embodiment, in the mask frame provided by the embodiments of the present disclosure, the width between the outer boundary of the forced side and the corresponding inner boundary is in a positive correlation with deformation amounts of the reference forced side under the same pulling force which has a constant width equal to a minimum width between the outer boundary and the corresponding inner boundary of the forced side of the mask.

In an exemplary embodiment, in the mask frame provided by the embodiments of the present disclosure, the positive correlation is expressed by a formula (1) as follows:

$$\Delta D = a + k * \Delta SD \quad (1)$$

where a, k, and $\Delta D$ are all greater than 0, a and k are constants, $\Delta SD$ is the deformation amounts of the reference forced side under the same pulling force which has a constant width which is the minimum width between the outer boundary and the corresponding inner boundary of the forced side of the mask, and $\Delta D$ is the width between the outer boundary and the corresponding inner boundary of the forced side.

In an exemplary embodiment, in the mask frame provided by the embodiments of the present disclosure, the outer boundary of the forced side is in a form of an arc projecting toward outside of the mask frame.

The mask frame according to claim 4, wherein the outer boundary of the forced side is in a stepped form.

Correspondingly, the embodiments of the present disclosure further provide a mask, comprising any mask frame provided by the embodiments of the present disclosure, and a plurality of mask bodies connected to the mask frame.

In an exemplary embodiment, in the mask provided by the embodiments of the present disclosure, the outer boundary of the forced side is in a stepped form and the number of steps of the stepped form equals to the number of the mask bodies.

Correspondingly, the embodiments of the present disclosure further provide a method for manufacturing a mask provided by the embodiments of the present disclosure, comprising:

applying a pulling force to the mask body so that a retracting force is generated in the mask body in a direction opposite to the pulling force; and welding a mask body having the retracting force into the mask frame.

DETAILED DESCRIPTION OF PREFERRED EMBODIMENTS

To make the objectives, technical solutions, and advantages of the present disclosure clearer, the embodiments of the present disclosure will now be described in conjunction with the accompanying drawings in the present disclosure, and it will be apparent that the described embodiments are merely part of the embodiments and not all of the embodiments of the present disclosure. Based on the embodiments of the present disclosure, all other embodiments obtained by those skilled in the art without inventive effort are within the scope of this disclosure.

The embodiments of the present disclosure provide a mask frame, a mask body, a mask and a method for manufacturing the same, which are used for reinforcing stability of the mask frame.

The embodiments of the mask frame, the mask body, the mask, and the method for manufacturing the same, the substrate and the display panel provided by the present disclosure will be described in detail below with reference to the Figures.

Figure 1:
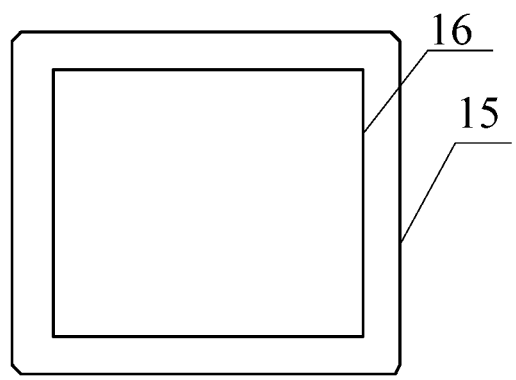
FIG. 1 is a schematic structural view of a metal mask frame according to an embodiment of the present disclosure.
Figure 2A:
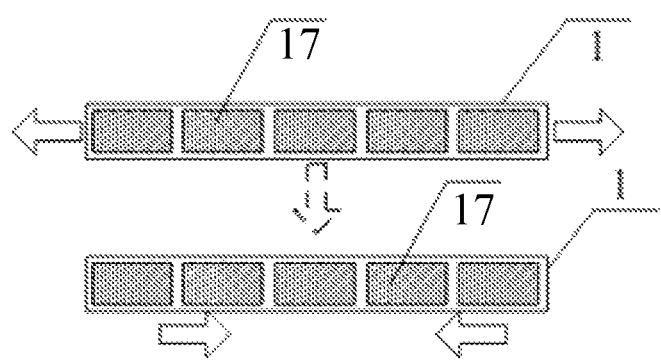
FIG. 2(*a*)-FIG. 2(*c*) are principle schematic views of making a metal mask using the metal mask frame as shown in FIG. 1.
Figure 2B:
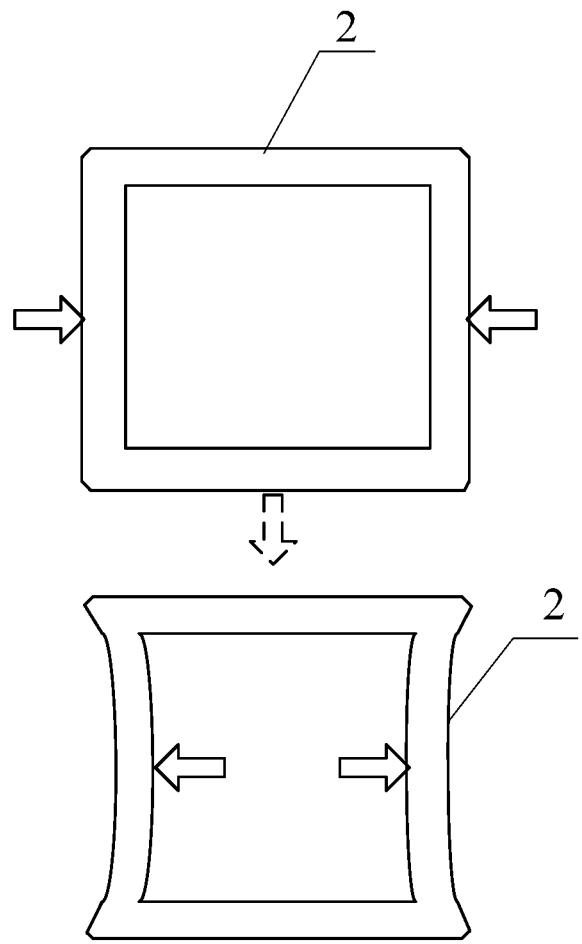
Figure 2C:
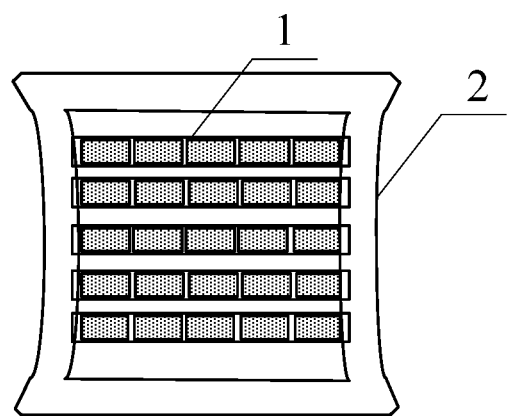

FIG. 1 is a schematic structural view of a metal mask frame according to an embodiment of the present disclosure. FIG. 2(a)-FIG. 2(c) are principle schematic views of making a metal mask using the metal mask frame shown in FIG. 1. As shown in FIG. 1, the mask frame includes an inner boundary 16 and an outer boundary 15, the outer boundary 15 enclosing a pattern in a form of rectangle and the inner boundary 16 also enclosing a pattern in a form of rectangle.

When the OLED material is evaporated onto the LTPS back plate by evaporation according to a predetermined process, referring to FIG. 2(a), a pulling force needs to be applied to the mask body 1 in advance so that a retracting force is generated in the mask body 1 in a direction opposite to the pulling force. The retracting force will deform the mask frame when the mask body 1 is placed on the mask frame for being welded. The mask body 1 includes a plurality of pixel units 17 in one-to-one correspondence with pixels, respectively. Therefore, in order to ensure the accuracy in alignment of the pixels, it is necessary to alleviate the deformation of the frame. Therefore, referring to FIG. 2(b), a pushing force is applied to the metal mask frame 2 in advance so that an outward deformation force is generated in the metal mask frame 2, and the mask body having the retracting force is then placed on the mask frame to perform a net stretching welding. With a principle that the outward force in the mask frame and the inward shrinkage force in the mask counteract each other, the deformation amount of the mask frame is reduced, so that the degree of the pixel position accuracy shift of the mask (Mask PPA Shift) is alleviated. Referring to FIG. 2(c), the mask frame 2 and the mask body 1 are in an equilibrium state, and the welding of five mask bodies is finished.

Figure 3:
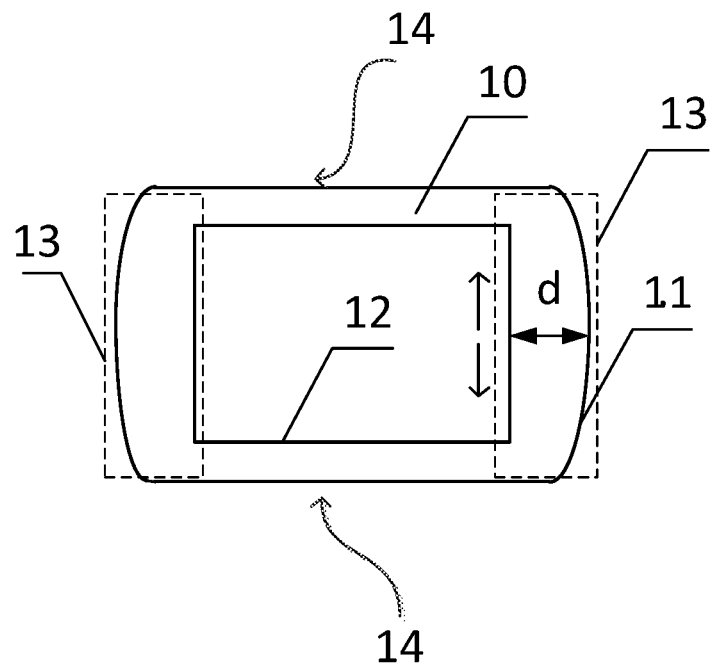
FIG. 3 is a schematic structural view of a mask frame according to an embodiment of the present disclosure.

Referring to FIG. 3, in which a schematic structural view of a mask frame 10 according to an embodiment of the present disclosure is shown. The mask frame 10 is a ring-shaped frame body that includes an outer boundary 11 and an inner boundary 12. The inner boundary 12 defines a space for accommodating the mask body. The mask frame has a forced side 13 and a non-forced side 14. The forced side 13 is subjected to a pulling force of the mask body, and the non-forced side 14 fails to be subjected to a pulling force of the mask body. As shown in FIG. 3, both of the left and right sides of the mask frame 10 are forced sides 13, and both of the upper and lower sides of the mask frame are non-forced sides 14.

The width d between the outer boundary 11 of the forced side 13 of the mask frame 10 and the corresponding inner boundary 12 is gradually reduced in a direction pointing towards the non-forced sides 14 from a middle position of the forced side 13 (in a direction as illustrated by the dashed arrow in FIG. 3).

In FIG. 3, a case is illustrated as an example that the outer boundary has a convex effect during a process in which the width between the outer boundary and the inner boundary gradually increases. Of course, it is also possible that the inner boundary has a convex effect during a process in which the width between the outer boundary and the inner boundary gradually increases, which may also be applied to the mask frame for welding the mask body thereon. Therefore, the mask frame provided by the embodiment of the present disclosure is not limited to the shape of the mask frame shown in FIG. 3. In addition, the shapes of the outer boundary and the inner boundary of the non-forced side of the mask frame are not particularly limited herein.

Before placing the mask body into the mask frame, it is necessary to apply a pulling force to the mask body such that a retracting force is generated in the mask body in a direction opposite to the pulling force. Due to the retracting force of the mask body, the inner side of the mask frame is subjected to a pulling force from the outside to the inside. Therefore, the forced side in the embodiment of the present disclosure will be subjected to the pulling force by the influence of the retracting force of the mask body. The forced side of the embodiment of the present disclosure refers to the side of the mask frame subjected to the pulling force of the mask body. The non-forced side of the embodiment of the present disclosure refers to the side of the mask frame that is not subjected to the pulling force of the mask body.

In addition, when the mask body is welded in the mask frame, the mask body is welded sequentially from the middle position to both sides of the mask frame, and a same pulling force should be applied to the mask body for each welding, so that a retracting force of the same direction and size is generated in each mask body, which is the pulling force applied to the forced side of the mask frame in the embodiment of the present disclosure. After the forced side of the mask frame is subjected to a same pulling force, the part of the inner boundary at the middle position has a larger deformation amount due to non-supporting effect of the inner boundary on the non-forced side, and the parts of the inner boundary on both sides of the middle position has a smaller deformation amount under the pulling force due to a supporting effect of the inner boundary on the non-forced side. For example, referring to FIG. 3, the direction of the dashed arrow is the direction from the middle point of the forced side to the non-forced side. Therefore, in the embodiment of the present disclosure, the direction in which the width between the outer boundary and the corresponding inner boundary of the forced side is the same direction as indicated by the arrow in FIG. 3.

It should be noted that the width between the outer boundary and the inner boundary of forced side corresponding to the outer boundary tends to decrease gradually in the direction from the middle point of the forced side to the non-forced sides, in a manner of a continuous reduction or a non-continuous reduction. As shown in FIG. 3, the variation tendency of the width between the outer boundary of the forced side and the inner boundary corresponding to the outer boundary is continuous but not limited to the variation as shown in FIG. 3. Other variations also belong to the protection scope of the present disclosure. There is no specific limitation here.

The mask frame provided by the embodiment of the present disclosure can be applied to the process of manufacturing various types of masks. For example, it can be applied to a metal mask frame for evaporation of high precision AMOLEDs, and also can be applied to a net stretching welding of etching masks and plating masks in the prior art. There is no specific limitation here.

Compared with the conventional mask frame, the width of the mask frame provided by the embodiment of the present disclosure between the outer boundary of the forced side and the inner boundary corresponding to the outer boundary is designed to decrease gradually in the direction from the middle position of the forced side to the non-forced side, as shown in FIG. 3. Therefore, the width of the middle position of the forced side of the mask frame provided by the embodiment of the present disclosure is the largest so that the forced side has stronger resistance, and the wider the width between the outer boundary and the inner boundary of the forced side is, the greater the resistance is formed, thus avoiding the deformation amount of the mask frame and increasing the stability of the mask frame.

In a specific embodiment, referring to FIG. 3, the inner boundary 12 of the mask frame 10 forms a rectangular shape.

The inner boundary of the mask frame in the embodiment of the present disclosure forms a rectangular for placing a plurality of mask bodies. Of course, the shape of the inner boundary of the mask is not limited to a rectangular shape but includes other shapes for welding the mask body. For example, the shape of the inner boundary of the mask frame for welding a mask body of a profiled screen may not be rectangular. There is no specific limitation here.

In a specific embodiment, in the mask frame provided by the embodiment of the present disclosure, in order to further improve the stability of the mask frame, it is possible to determine the width of the forced side depending on the deformation amounts of the reference forced side under a pulling force which has a constant width which is the minimum width between the outer boundary and the corresponding inner boundary of the mask. Specifically, the width between the outer boundary and the inner boundary corresponding to the outer boundary of the forced side is proportional to the deformation amounts of the reference forced side under the same pulling force which has a constant width which is the minimum width between the outer boundary and the corresponding inner boundary of the mask.

In a specific embodiment, in the mask frame provided by the embodiment of the present disclosure, in order to further determine the proportional correlation between the width of the forced side between the outer boundary and the inner boundary of the mask frame and the deformation amounts of the reference forced side under the same pulling force which has a constant width which is the minimum width between the outer boundary and the corresponding inner boundary of the mask. Specifically, a formula (1) as below is satisfied:

$$\Delta D = a + k * \Delta SD \ (a, k, \Delta SD \text{ are all greater than } 0) \qquad (1)$$

a and k are constants, $\Delta SD$ is the deformation amounts of the reference forced side under the same pulling force which has a constant width which is the minimum width between the outer boundary and the corresponding inner boundary of the mask, and $\Delta D$ is the width between the outer boundary and the corresponding inner boundary of the forced side. The deformation amounts are for example the displacement amounts of the forced side of the mask frame in the pulling force direction.

Values of a and k are determined on a basis of different types of mask frame. Specifically, a is the minimum value of the width of the forced side of the mask frame between the outer boundary and the inner boundary corresponding to the outer boundary, and the forced side with such a width is used as the reference forced side, and k is related to the material of the mask frame and a shape retention property of the mask frame, so k is an empirical constant. As to different mask frame, a and k values are different. Magnitudes of $\Delta D$ and $\Delta SD$ are of micron order.

Figure 4:
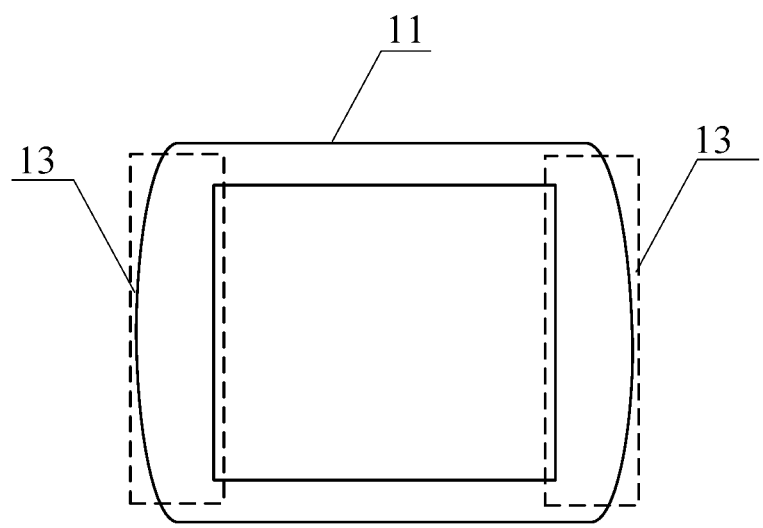
FIG. 4 is a schematic structural view of another mask frame according to an embodiment of the present disclosure.

In an exemplary embodiment, in the mask frame provided by the embodiment of the present disclosure, referring to FIG. 4, the shape of the outer boundary 11 of the forced side 13 is an arc convex toward the exterior of the mask frame.

The size of the arc may be designed according to the above formula (1), or the size of the arc may also be designed by itself, which is not limited herein.

The calculation principle of the formula (1) will be described in detail below by taking a specific embodiment and taking the outer boundary of the forced side as an arc as an example.

Figure 5:
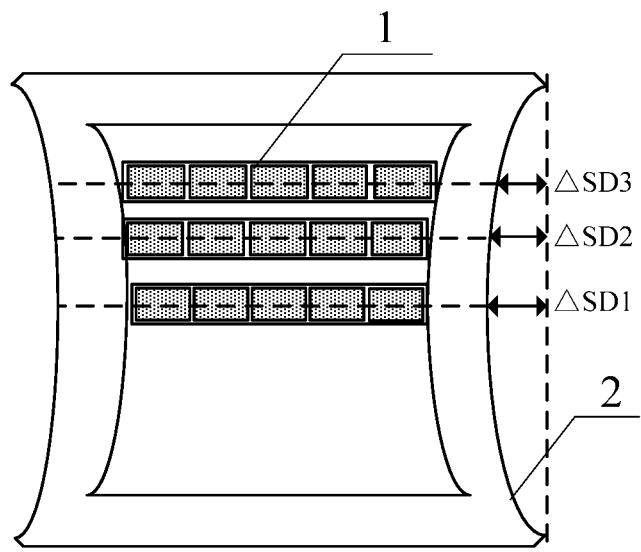
FIG. 5 is a schematic structural view of a deformation amount of a mask frame subjected to an external force as a comparative example.

First, in order to describe the deformation of $\Delta SD$ more clearly, it is explained with reference to illustration of FIG. 5. The mask frame 2 as a reference comparative example has a rectangular shape, the outer boundary and the inner boundary of the forced side are parallel to each other, and the widths between the outer boundary and the inner boundary of the forced side of the mask frame are kept being same. When the mask is welded, the mask bodies 1 are sequentially placed onto the mask frame 2. Before the mask bodies are placed onto the mask frame, it is necessary to apply a same pulling force to each of the mask bodies so that a retracting force in the same direction and of the same size are generated in each mask body. Due to the retracting force generated in the mask body 1, the mask frame 2 is deformed. Due to the structure of the mask frame, the deformation amount is the largest at the middle position of the forced side after being subjected to the retracting force, and the deformation amount generated at both sides of the middle position gradually decreases after being subjected to the retracting force. Therefore, under the action of the retracting force of the mask body 1, the deformation amount generated on the forced side of the mask frame 2 gradually decreases from the middle to both sides. As shown in FIG. 5, in a direction from the middle to both sides, the deformation amounts as generated are designated in turn as: $\Delta SD1$, $\Delta SD2$ and $\Delta SD3$. The values of the deformation amount generated in the mask frame 2 vary according to actual disclosures, without being limited herein. Therefore, the present disclosure improves the structure of the mask frame according to the deformation amount of the mask frame 2 provided by the comparative example.

Figure 6:
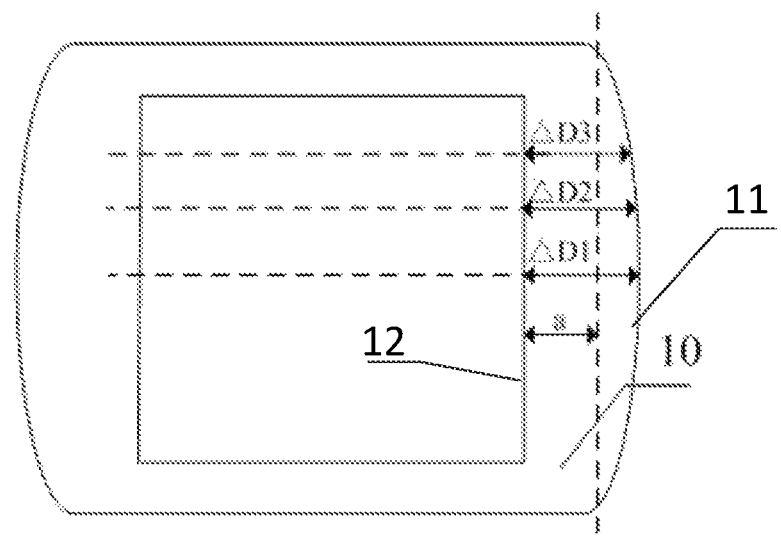
FIG. 6 is a schematic structural view of yet another mask frame according to the embodiment of the present disclosure.

Referring to FIG. 6, the mask frame provided by the embodiment of the present disclosure is an improvement to the mask frame 2 of the comparative example shown in FIG. 5, in which the outer boundary 11 of the forced side is set to be an arc convex toward outside of the mask frame, so that the width between the outer boundary 11 and the corresponding inner boundary 12 of the forced side is the largest at the middle position on the forced side and then gradually decreases to the minimum width a from the middle position toward the non-forced sides. For convenience of description, the forced side having the constant width a between the outer boundary 11 and the inner boundary 12 on the forced side of the mask frame 2 serves as the reference forced side. Referring to FIG. 6, the minimum value of the width between the outer boundary on the forced side of the mask frame 10 and the inner boundary corresponding to the outer boundary is a. The position corresponding to the mask body in FIG. 5 is indicated by a horizontal dashed line in FIG. 6. Referring to FIGS. 5 and 6, at the position where the deformation amount of the forced side in FIG. 5 is $\Delta SD1$, the width of the forced side in FIG. 6 is set as $\Delta D1$; at the position where the deformation amount of the forced side in FIG. 5 is ΔSD2, the width of the forced side in FIG. 6 is set as ΔD2; and at the position where the deformation amount of the forced side in FIG. 5 is ΔSD3, the width of the forced side in FIG. 6 is set as ΔD3. According to above formula (1), it can be obtained that ΔD1=a+k*ΔSD1, ΔD2=a+k*ΔSD2, ΔD3=a+k*Δ SD3 can be obtained. By selecting appropriate values for a and k, the deformation amount of the forced side of the mask frame can be reduced to zero according to the embodiment of the present disclosure shown in FIG. 6.

As described above, the above structure of the mask frame 10 provided by the embodiment of the present disclosure may eliminate the deformation amount generated in the mask frame under the condition that it is subjected to the retracting force of the mask body, enhancing stability of the mask frame.

In order to further enhance the stability of the mask frame, when designing the outer boundary shape of the forced side of the mask frame according to the formula (1), specific number of the times to calculate ΔD may be increased so that the forced side of the mask frame may offset the pulling force when it is subjected to a same pulling force at any positions.

According to one example, the number of times to calculate ΔD is the same as the number of mask bodies welded by using the mask frame provided by the embodiment of the present disclosure.

It should be noted that, when calculating ΔD and ΔSD, the position corresponding to the center line of the mask body may be selected.

Figure 7:
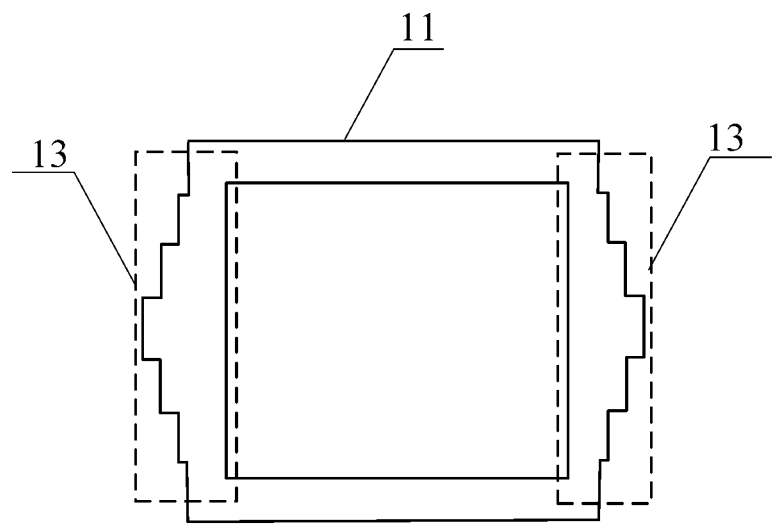
FIG. 7 is a schematic structural view of yet another mask frame according to an embodiment of the present disclosure.

In an exemplary embodiment, in the mask frame provided by the embodiment of the present disclosure, referring to FIG. 7, the shape of the outer boundary 11 of the forced side 13 is step-shaped.

According to one example, in order to further enhance the stability of the mask frame, in case that the outer boundary of the forced side is designed to be stepped, the width of each step may be calculated according to formula (1) in turn. Each calculation of a ΔD corresponds to one step.

Figure 8:
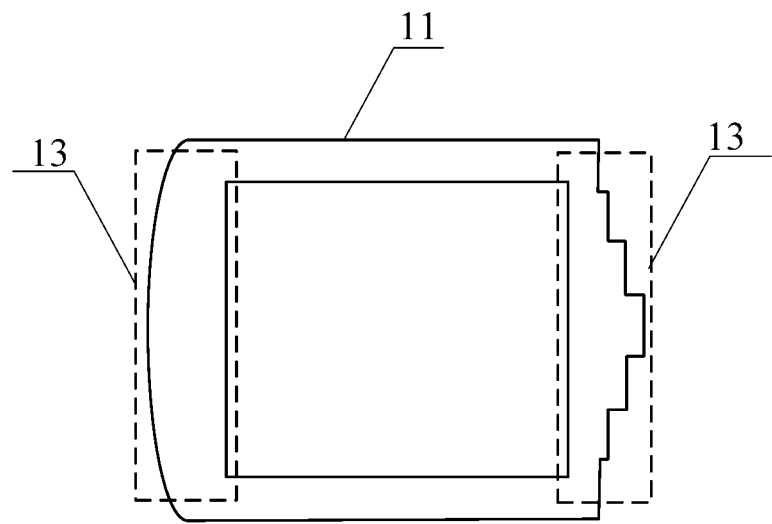
FIG. 8 is a schematic structural view of yet another mask frame according to an embodiment of the present disclosure.

It should be noted that, the mask frame provided by the embodiment of the present disclosure has two forced sides opposite to each other, the outer boundaries of the two forced sides are both arc-shaped, or the outer boundaries of the two forced sides are step-shaped. Alternatively, referring to FIG. 8, the outer boundary 11 of a forced side 13 is arc-shaped and the outer boundary 11 of the other forced side 13 is step-shaped. There is no specific limitation here.

In summary, the width between the outer boundary of the forced side and the corresponding inner boundary of the mask frame provided by the embodiment of the present disclosure gradually decreases in a direction from the middle position of the forced side toward the non-forced side(s). Specifically, the shape of the outer boundary of the forced side of the mask frame is arc-shaped or the shape of the outer boundary of the forced side of the mask frame is step-shaped, and the width between the inner boundary and the outer boundary at the middle position of the forced side is the largest. Since the width between the outer boundary of the forced side of the mask frame and the corresponding inner boundary is determined correspondingly in accordance with the deformation amounts of the reference forced side under the same pulling force which has a constant width which is the minimum width between the outer boundary and the corresponding inner boundary of the mask. Therefore, the forced side of the mask frame provided by the embodiment of the present disclosure has a stronger resistance force after being subjected to an external pulling force. The wider the width between the inner boundary and the outer boundary of the forced side is, the greater the resistance is formed, so that the deformation of the mask frame is avoided and the stability of the mask frame is increased.

Based on the same inventive concept, an embodiment of the present disclosure further provides a mask, which includes a plurality of mask bodies welded by using any one of the mask frames provided in the embodiments of the present disclosure.

Figure 9:
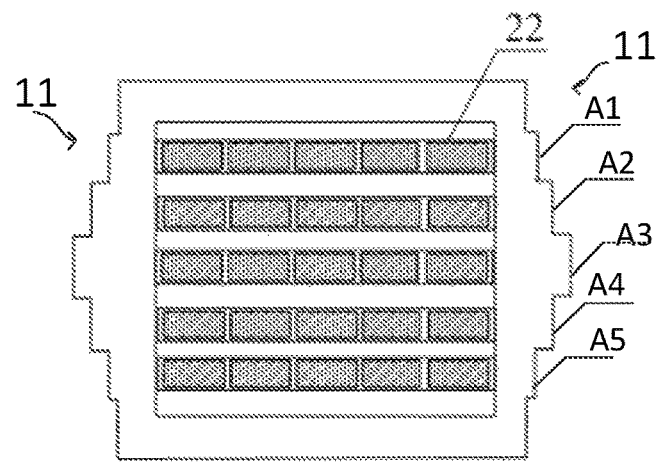
FIG. 9 is a schematic structural view of a mask provided by an embodiment of the present disclosure.

In a specific embodiment, in the mask body provided by the embodiment of the present disclosure, referring to FIG. 9, the number of steps of the stepped outer boundary on the forced side of the mask frame is the same as that of the mask bodies 22 provided by the embodiment of the present disclosure. For example, in the case that five mask bodies 22 are shown in FIG. 9, the stepped outer boundary 11 on the forced side of the mask frame includes five steps, i.e., A1, A2, A3, A4, and A5.

In FIG. 9, it is schematically illustrated that the mask includes only five mask bodies 22. In practical application, a plurality of mask bodies may be placed. This is merely an illustration and does not limit the size and number of mask bodies in practical applications.

Specifically, under the effect of the retracting force of the mask body, the mask frame is subjected to the same pulling forces on the forced side and each of the mask bodies has the same retracting force, so that the number of pulling forces to which the forced side is subjected and the number of mask bodies are same. In order to prevent the mask frame from being deformed when the mask frame is subjected to a pulling force at each time, a relatively stable structure is provided. According to an embodiment, the number of the stepped steps in the forced side is the same as that of the pulling force to which the inner boundary of the forced side is subjected, and the size of each step may be obtained by the formula (1).

Figure 10:
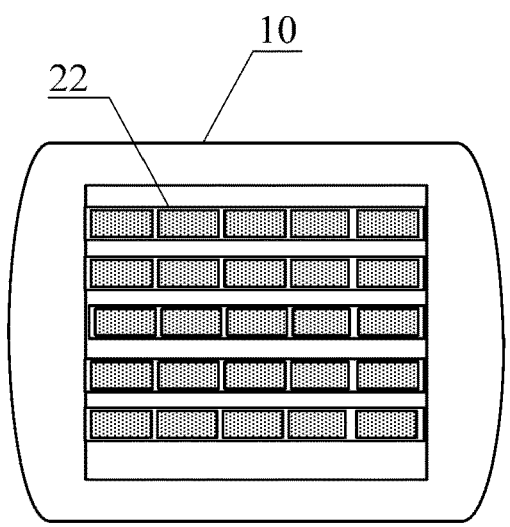
FIG. 10 is a schematic structural view of another mask according to an embodiment of the present disclosure.

Based on the same inventive concept, an embodiment of the present disclosure further provides a mask. Referring to FIG. 10, the mask includes a mask body 22 and any one of the mask frames 10 provided in the embodiments of the present disclosure. In FIG. 10, only the case that the outer boundary of the forced side of the mask frame 10 is arc-shaped is taken as an example. Of course, any mask frames provided by the embodiment of the present disclosure may be adopted, which are not described herein again.

Compared with the prior art, the mask provided by the embodiment of the present disclosure has the following beneficial effects:

As the mask frame provided by the embodiment of the present disclosure has strong stability and is not easy to be deformed, the mask formed by welding the mask body with the mask frame provided by the embodiment of the present disclosure has a strong stability, so as to ensure the accuracy of the pixel location, and to solve color mixing problems due to instability of the mask.

The mask provided by the embodiment of the present disclosure can be applied to production of various types of masks with different sizes and different degrees of clarity. The mask according to the embodiment of the present disclosure provides a prerequisite for making a high-precision mask.

The mask provided in the embodiment of the present disclosure only improves the structure of the mask frame without adding any external matters to the mask body, and thus simplifies the improved mask production.

Based on the same inventive concept, an embodiment of the present disclosure further provides a substrate, which is manufactured by using the mask provided by the embodiment of the present disclosure.

By using the mask provided in the embodiment of the present disclosure to manufacture the substrate, the color mixing phenomenon in the substrate will be further avoided. The substrate provided by the embodiment of the present disclosure may be an array substrate, a color filter substrate, or the like.

Based on the same inventive concept, an embodiment of the present disclosure further provides a display panel, including the substrate provided by the embodiment of the present disclosure.

Figure 11:
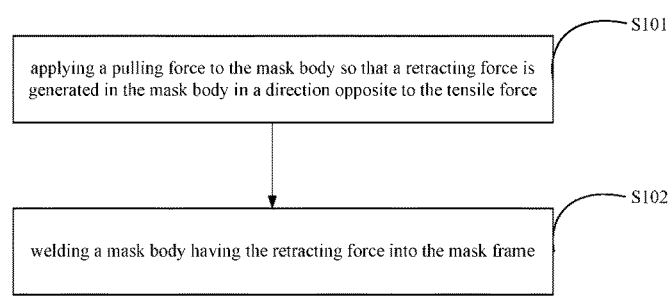
FIG. 11 is a schematic flow chart of a method for manufacturing a mask according to an embodiment of the present disclosure.

Based on the same inventive concept, referring to FIG. 11, an embodiment of the present disclosure further provides a method for manufacturing a mask, which includes:

S101, applying a pulling force to the mask body so that a retracting force is generated in the mask body in a direction opposite to the pulling force;

S102, placing a mask body having the retracting force into the mask frame, and welding the mask body.

In the prior art, when the mask is manufactured by using the mask frame shown in FIG. 1, a pulling force is firstly applied to the mask body to generate a retracting force in an opposite direction in the mask body, as shown in FIG. 2(a). Secondly, a pushing force is applied to the mask frame so that a deformation force for expansion outward is generated in the metal mask frame as shown in FIG. 2(b). Since the applied pushing force needs to counteract the pulling force exerted to each mask body when being welded, the magnitude of the pushing force needs to be adjusted according to each time the mask body is welded. In general, the pushing force is determined based on a system simulation and production process experience, and then the magnitude of the production process experience is also different, so the size of the pushing force is not easy to be controlled. Finally, the mask body with a retracting force it placed into the mask frame for welding. As the release of the pushing force to the mask frame is dynamic and decreases progressively, the deformation of the mask frame is in different deformation states.

However, in the embodiment of the present disclosure, when a mask is manufactured by using the mask frame provided by the present disclosure, a pulling force is firstly applied to the mask body, so that a retracting force in an opposite direction is generated in the mask body, as shown in FIG. 2(a); and then the mask body having the retracting force is placed into the mask frame for welding. Since the mask frame provided by the embodiment of the present disclosure has strong stability and may counteract the effect of the retracting force on the mask frame by its own structure once affected by the retracting force of the mask body. Therefore, the manufacturing method of the mask provided by the embodiment of the present disclosure not only save a process, that is, it does not need to exert a pushing force on the mask frame and thus avoids the deformation of the mask frame due to the dynamic process of releasing the pushing force. In summary, the manufacturing method of the mask provided in the embodiments of the present disclosure improves the accuracy of the pixel position of the mask.

To sum up, the embodiments of the present disclosure provide a mask frame and a mask body, a mask and a manufacturing method thereof, a substrate and a display panel, wherein the width between the outer boundary and the corresponding inner boundary of the forced side of the mask frame gradually decreases in a direction from the middle position of the forced side to the non-forced side(s). Therefore, in the embodiment of the present disclosure, by increasing the width between the outer boundary and the inner boundary of the forced side, the wider forced side is not easy to be deformed when subjected to the pulling force. It can be seen that the mask frame provided by the present disclosure enhances the ability to resist external pulling force so that the mask frame is not easy to be deformed after being subjected to a pulling force, improving the stability of the mask frame.

Obviously, those skilled in the art may make various modifications and variations to the present disclosure without departing from the spirit and scope of the present disclosure. In this way, if these modifications and variations of the present disclosure fall within the scope of the claims of the present disclosure and the equivalent technologies, the present disclosure is also intended to include these modifications and variations.

What is claimed is:

1. A mask frame, comprising:
a loop shaped frame body comprising an outer boundary and an inner boundary of the mask frame, the inner boundary defining a space for receiving a mask body;
wherein the mask frame comprises a forced side and a non-forced side, the forced side being subjected to a pulling force of the mask body, the non-forced side being free from the force of the mask body; and
wherein a width between the outer boundary of the forced side of the mask frame and the inner boundary corresponding to the outer boundary decreases gradually in a direction from a middle position on the forced side toward the non-forced side, and
wherein:
at least a section of the forced side is arc-shaped, and in the arc-shaped section, the width between the outer boundary of the forced side and the corresponding inner boundary is set to be proportional to deformation amounts of a hypothetical reference forced side under the same pulling force, wherein the hypothetical reference forced side has a constant width equal to a minimum width between the outer boundary and the corresponding inner boundary of the forced side of the mask, or
the forced side comprises a plurality of sections which have a constant width respectively, and the width between the outer boundary of each of the plurality of sections and the corresponding inner boundary is set to be proportional to deformation amounts at a position of the hypothetical reference forced side corresponding to a middle position of each of the plurality of sections under the same pulling force.

2. The mask frame according to claim 1, wherein the inner boundary of the mask frame forms a rectangular shape.

3. The mask frame according to claim 1, wherein a relationship between the width between the outer boundary of the forced side and the corresponding inner boundary and the deformation amounts of the hypothetical reference forced side is expressed by a formula (1) as follows:

$$\Delta D = a + k * \Delta SD \quad (1)$$

where a, k, and $\Delta D$ are all greater than 0, a and k are constants, $\Delta SD$ is the deformation amounts of the hypothetical reference forced side under the same pulling force which has a constant width which is the minimum width between the outer boundary and the corresponding inner boundary of the forced side of the mask, and $\Delta D$ is the width between the outer boundary and the corresponding inner boundary of the forced side.

4. The mask frame according to claim 3, wherein the outer boundary of the forced side is in a form of an arc projecting toward outside of the mask frame.

5. The mask frame according to claim 3, wherein the outer boundary of the forced side is in a stepped form, and each step of the stepped form is provided with a mask body, wherein each step has a width at the position of a center line of the mask body provided on the step that is proportional to deformation amounts of the hypothetical reference forced side.

6. A mask, comprising a mask frame according to claim 1, and a plurality of mask bodies connected to the mask frame.

7. The mask according to claim 6, wherein the outer boundary of the forced side of the mask frame is in a stepped form and the number of steps of the stepped form equals the number of the mask bodies.

8. A method for manufacturing a mask according to claim 6, comprising:
applying a pulling force to the mask body so that a retracting force is generated in the mask body in a direction opposite to the pulling force; and
welding a mask body having a retracting force into the mask frame.

9. A mask, comprising a mask frame according to claim 2, and a plurality of mask bodies connected to the mask frame.

10. A mask, comprising a mask frame according to claim 3, and a plurality of mask bodies connected to the mask frame.

11. A mask, comprising a mask frame according to claim 4, and a plurality of mask bodies connected to the mask frame.

12. A mask, comprising a mask frame according to claim 5, and a plurality of mask bodies connected to the mask frame.

13. The mask frame according to claim 1, wherein the hypothetical reference forced side which has a constant width is deformed into an arc convex toward the center of the mask frame after being subjected to the same pulling force.

* * * * *